(12) United States Patent
Shin et al.

(10) Patent No.: US 9,652,836 B2
(45) Date of Patent: May 16, 2017

(54) DEFECT CELL CLUSTERING METHOD AND APPARATUS THEREOF

(71) Applicant: SAMSUNG SDS CO., LTD., Seoul (KR)

(72) Inventors: Kae Young Shin, Yongin-si (KR); Dae Jung Ahn, Yongin-si (KR); Ji Young Park, Yongin-si (KR); Ji Min Kang, Yongin-si (KR)

(73) Assignee: SAMSUNG SDS CO., LTD., Seoul (KR)

( * ) Notice: Subject to any disclaimer, the term of this patent is extended or adjusted under 35 U.S.C. 154(b) by 476 days.

(21) Appl. No.: 14/291,947

(22) Filed: May 30, 2014

(65) Prior Publication Data

US 2014/0358484 A1    Dec. 4, 2014

(30) Foreign Application Priority Data

May 31, 2013    (KR) .......................... 10-2013-0062418

(51) Int. Cl.
*H03F 1/26*    (2006.01)
*G06T 7/00*    (2017.01)
(Continued)

(52) U.S. Cl.
CPC .............. *G06T 7/0004* (2013.01); *G06T 7/45* (2017.01); *G06T 2207/20072* (2013.01); *G06T 2207/30121* (2013.01); *H01L 22/20* (2013.01)

(58) Field of Classification Search
CPC ................... G06T 7/0004; G06T 7/404; G06T 2207/30121; G06T 2207/20072; H01L 22/20; G11C 29/02; G11C 29/804
(Continued)

(56) References Cited

U.S. PATENT DOCUMENTS 6,301,165 B1 * 10/2001 Kim ....................... G11C 29/50
365/189.07
6,885,950 B2    4/2005 Mitsutake et al.
(Continued)

FOREIGN PATENT DOCUMENTS

CN    101432864 A    5/2009
JP    10-214866 A    8/1998
(Continued)

OTHER PUBLICATIONS

Communication dated Jun. 25, 2015 issued by Korean Intellectual Property Office in counterpart Korean Patent Application No. 10-2013-062418.
(Continued)

*Primary Examiner* — An Do
(74) *Attorney, Agent, or Firm* — Sughrue Mion, PLLC

(57) ABSTRACT

Provided are a method of clustering defects generated in bad samples shown on a defect map of bad samples including bad products, and an apparatus thereof. The defect cell clustering method includes generating a sample defect map showing a defect cell distribution by cell positions of bad samples comprised of products each including one or more defect cells among products each partitioned into a plurality of cells, selecting at least some cell positions having one or more defect cells as clustering targets from the sample defect map, selecting one or more suspected bad equipments for each of cell positions included in the clustering targets using pass equipment information for the product, and grouping the clustering targets into one or more clusters according to position coherence between a first cell position and a second cell position included in one cluster, the cell position and the second cell position each having at least one suspected bad equipment.

10 Claims, 12 Drawing Sheets

(51) Int. Cl.
*G06T 7/45* (2017.01)
*H01L 21/66* (2006.01)

(58) Field of Classification Search
USPC ............... 702/127, 189, 190; 365/185.2, 200
See application file for complete search history.

(56) References Cited

U.S. PATENT DOCUMENTS

| | | | |
|---|---|---|---|
| 7,472,330 B2* | 12/2008 | Jedwab | ............. G11C 11/16 714/763 |
| 7,529,634 B2 | 5/2009 | Mitsutake et al. | |
| 2009/0306922 A1 | 12/2009 | Toyoshima | |

FOREIGN PATENT DOCUMENTS

| | | |
|---|---|---|
| JP | 2005-236094 A | 9/2005 |
| JP | 2008108815 A | 5/2008 |
| JP | 4786505 B2 | 10/2011 |
| KR | 10-2002-0015288 A | 2/2002 |
| KR | 10-0742425 B1 | 7/2007 |

OTHER PUBLICATIONS

Communication dated Dec. 31, 2014 issued by Korean Intellectual Property Office in counterpart Korean Patent Application No. 10-2013-0062418.
Office Action dated Dec. 23, 2016 issued by the SIPO in Chinese Patent Application No. 201410228803.2.
Liu, Feng, "Wafer Defects Issue Study in Lithography", China Master's Theses Full-text Database, May 15, 2013, pp. 30-35, Issue 5.

* cited by examiner

FIG. 4

| CELL | EQUIPMENT ID (PROCESS_EQUIPMENT) | BAD RATIO |
|---|---|---|
| A00 | PHOTO_X04 | 2/30 |
| | PHOTO_X08 | 12/30 |
| | PHOTO_X09 | 1/30 |
| | ⋮ | ⋮ |
| | DRY_D20 | 4/40 |
| | DRY_D04 | 32/40 |
| | ⋮ | ⋮ |
| B00 | PHOTO_X04 | 1/20 |
| | PHOTO_X08 | 16/20 |
| | PHOTO_X09 | 0 |
| | ⋮ | ⋮ |
| | DRY_D20 | 1/50 |
| | DRY_D04 | 42/50 |
| C02 | ⋮ | ⋮ |

FIG. 5

| CELL | TOP 10 OF BAD RATIOS |
|---|---|
| A00 | DRY_D04 (32/40) |
|  | PHOTO_X08 (12/30) |
|  | PHOTO_X09 (10/30) |
|  | ⋮ |
| B00 | DRY_X04 (42/50) |
|  | PHOTO_X08 (16/20) |
|  | DRY_F12 (30/50) |
|  | ⋮ |
| C02 | ⋮ |

FIG. 6

| SUSPECTED BAD EQUIPMENT CANDIDATE SET |
|---|
| DRY_D04 |
| PHOTO_X08 |
| PHOTO_F12 |
| PHOTO_F21 |
| ⋮ |

FIG. 7

| CELL | SUSPECTED BAD EQUIPMENT CANDIDATE | BAD RATIO | GOOD RATIO | SUSPECTED BAD FACTOR |
|---|---|---|---|---|
| A00 | DRY_D04 | 33/40 | 2/100 | 0.78 |
| | PHOTO_X08 | 12/30 | 25/80 | 0.0875 |
| | PHOTO_X21 | 10/30 | 52/80 | 0 |
| | ⋮ | ⋮ | ⋮ | ⋮ |
| B00 | DRY_D04 | 42/50 | 2/100 | 0.82 |
| | PHOTO_X08 | 16/20 | 25/80 | 0.4875 |
| | DRY_F12 | 30/50 | 38/100 | 0.22 |
| | ⋮ | ⋮ | ⋮ | ⋮ |
| C02 | ⋮ | ⋮ | ⋮ | ⋮ |

| CELL | SUSPECTED BAD FACTOR<br>(= SUSPECTED BAD FACTOR TOP3) |
|------|------|
| A00  | DRY_D04<br>PHOTO_X08 |
| B00  | DRY_D04<br>PHOTO_X08<br>DRY_F12 |
| C02  | ⋮ |

DEFECT CELL CLUSTERING METHOD AND APPARATUS THEREOF

CROSS-REFERENCE TO RELATED APPLICATION

This application claims priority from Korean Patent Application No. 10-2013-0062418 filed on May 31, 2013 in the Korean Intellectual Property Office, and all the benefits accruing therefrom under 35 U.S.C. 119, the contents of which in its entirety are herein incorporated by reference.

BACKGROUND

1. Field of the Invention

The present invention relates to an apparatus and method of clustering defects generated at different positions of a product. More particularly, the present invention relates to a method of clustering defects generated in bad samples shown on a defect map of bad samples including bad products, and an apparatus thereof.

2. Description of the Related Art

When defects are generated at different positions of products, it is necessary to cluster the defects for performing various analyses for achieving product/process/equipment stabilization, including commonality analysis, history analysis, delay time analysis, and so on.

In the conventional defect clustering method, clustering is simply produced based on distances between the positions of defects generated. That is to say, in the conventional defect clustering method, defects being adjacent to each other are grouped as one cluster, irrespective of causes of the respective defects generated.

SUMMARY

The present invention provides a method of clustering defects by further reflecting suspected bad equipment information of each product selected based on work-in-process (WIP) information of the product, and an apparatus thereof.

The present invention also provides a defect clustering method specialized to a small-sized display manufacturing process, and an apparatus thereof.

The present invention also provides a method of clustering defects in units of cells included in each product, and an apparatus thereof.

The present invention also provides a defect clustering method, which can construct one cluster comprised of defects that are not adjacent to each other, and an apparatus thereof.

These and other objects of the present invention will be described in or be apparent from the following description of the preferred embodiments.

According to an aspect of the present invention, there is provided a defect cell clustering method includes generating a sample defect map showing a defect cell distribution by cell positions of bad samples comprised of products each including one or more defect cells among products each partitioned into a plurality of cells, selecting at least some cell positions having one or more defect cells as clustering targets from the sample defect map, selecting one or more suspected bad equipments for each of cell positions included in the clustering targets using pass equipment information for the product, and grouping the clustering targets into one or more clusters according to position coherence between a first cell position and a second cell position included in one cluster, the cell position and the second cell position each having at least one suspected bad equipment.

According to another aspect of the present invention, there is provided a defect cell clustering method including generating a sample defect map showing a defect cell distribution by cell positions of bad samples comprised of products each including one or more defect cells among products each partitioned in a plurality of cells, selecting as clustering targets cell positions having defect cells of greater than or equal to a reference number among cell positions having one or more defect cells from the sample defect map, and grouping the clustering targets into one or more clusters such that a position coherence is establish between a first cell position and a second cell position included in one cluster.

According to still another aspect of the present invention, there is provided a computer-readable recording medium having a computer program for executing the defect cell clustering method or apparatus.

According to a further aspect of the present invention, there is provided a defect cell clustering apparatus including a sample selecting unit generating a sample defect map showing a defect cell distribution by cell positions of bad samples comprised of products each including one or more defect cells among products each partitioned in a plurality of cells, a high bad ratio cell selecting as clustering targets cell positions having defect cells of greater than or equal to a reference number among cell positions having one or more defect cells from the sample defect map, a suspected bad equipment selecting unit selecting one or more suspected bad equipments for each of cell positions included in the clustering targets using pass equipment information for the product, which is derived from work-in-process (WIP) information, and a clustering unit grouping the clustering targets into one or more clusters according to the position coherence between a first cell position and a second cell position included in one cluster, the cell position and the second cell position each having at least one suspected bad equipment.

As described above, according to the present invention, since clustering is carried out in consideration of not only defect cell positions but equipments causing defect cells, accurate defect clustering results can be obtained.

In addition, when defect cells are not adjacent to each other but are correlated to each other, they can be grouped into one cluster.

In addition, for a product of glass used in a small-sized display, such as an organic light emitting diode (OLED), clustering is carried out on a cell basis, rather than on a defect spot basis, utilizing the fact that a cell is sufficiently small, thereby clustering defects in a manner specialized to a small-sized display manufacturing process.

Further, since clustering is carried out according to whether or not a cell is bad, operation loads required for clustering can be reduced.

BRIEF DESCRIPTION OF THE DRAWINGS

The above and other features and advantages of the present invention will become more apparent by describing in detail preferred embodiments thereof with reference to the attached drawings in which:

FIGS. 4 to 8 are conceptual diagrams for explaining a method for selecting suspected bad equipments for the respective cell positions according to the defect cell clustering method shown in FIG. 1;

FIG. 9 is a conceptual diagram for explaining a process of assigning a coordinate value to each cell to test whether a position coherence is established or not according to the defect cell clustering method shown in FIG. 1;

DETAILED DESCRIPTION OF THE EMBODIMENTS

Figure 1:
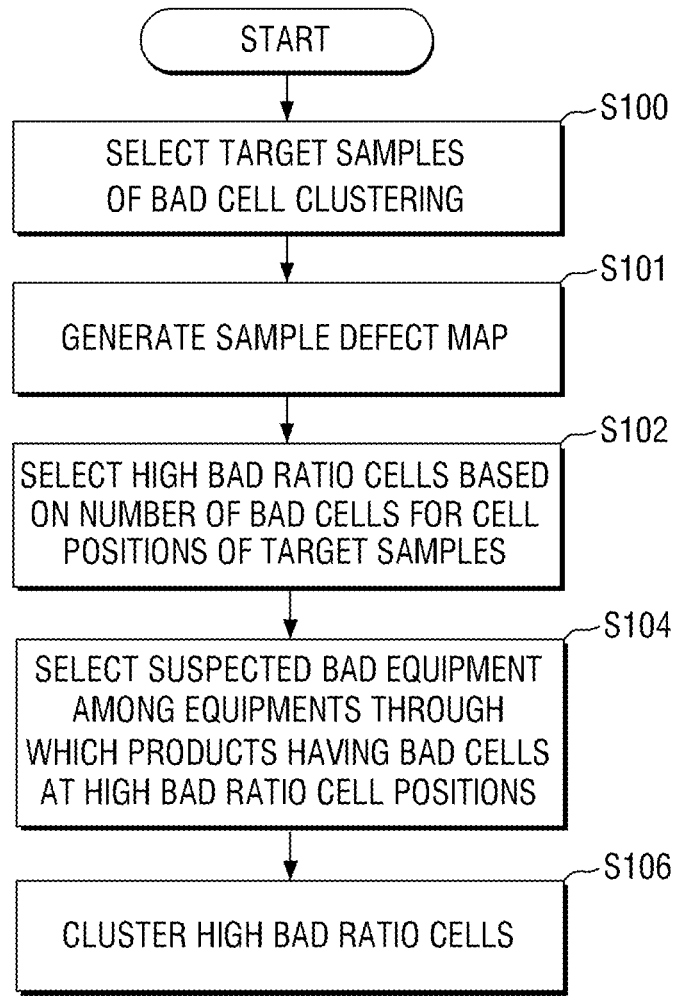
FIG. 1 is a flowchart of a defect cell clustering method according to an embodiment of the present invention.

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Throughout the specification of the present invention, a product is limited to one defined in units of cells. The product may include, for example, a semiconductor wafer, a display glass, or the like.

Hereinafter, a defect cell clustering method according to an embodiment of the present invention will be described with reference to FIG. 1.

First, bad samples as targets for defective equipment determination are selected (S100). The bad samples include products each having at least one defect cell. A product inspection device determines whether or not each cell included in the product is bad. Standards for selecting the bad samples may be input from a process manager terminal (not shown). The standards for selecting the bad samples may include, for example, at least one of a badness identifier, information for determining the badness identifier (e.g., Good, Reject, Hold, etc.), product name, and inspected data extraction period.

If the bad samples are selected, a sample defect map is generated, the sample defect map showing a defect cell distribution by cell positions of the selected bad samples (S101). The generating of the sample defect map will briefly be described with reference to FIG. 2.

Figure 2:
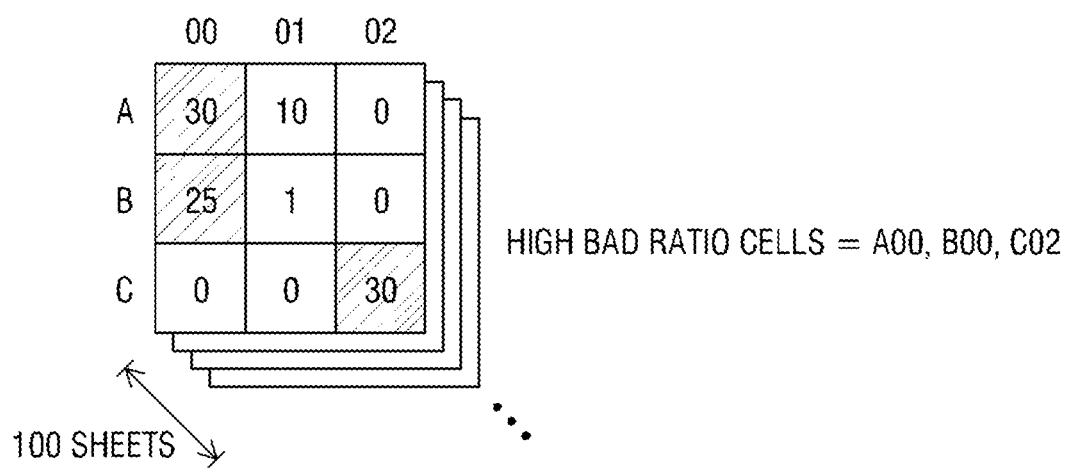
FIG. 2 is a conceptual diagram for explaining a sample defect map according to an embodiment of the present invention.

FIG. 2 shows a sample defect map for bad samples comprised of 100 glass sheets each having 3×3 cells. Referring to FIG. 2, 30 defect cells are positioned at a cell position A00, 10 defect cells are positioned at a cell position A01, 25 defect cells are positioned at a cell position B00, one defect cell is positioned at a cell position B01, and 30 defect cells are positioned at a cell position C02. What is meant by the expression "30 defect cells are positioned at a cell position A00." is that 30 glass sheets among whole bad samples has a defect cell in the cell A00.

The generating of the sample defect map may be performed by inspecting whether or not cells included in each glass sheet of the bad samples are bad and collecting a number of defect cells inspected by each cell position. It can be derived from inspection data prepared by the product inspection device whether or not cells included in each glass sheet of the bad samples are bad.

Throughout the specification of the present invention, the expression 'sample defect map' indicates how many defect cells are distributed throughout the samples on the basis of cell positions. In order to prepare the sample defect map, products having the same cell configuration are preferably included in bad samples.

For the sake of convenient explanation, FIG. 2 shows a case where a glass sheet is partitioned into 9 cells. However, one glass sheet may be partitioned into more than several hundreds of cells. Therefore, in order to reduce operation loads required for clustering and to filter meaningless noises, some of cell positions having one or more defect cells are selected from the sample defect map as clustering targets. In more detail, on the basis of a number of defect cells of cell positions having one or more defect cells, some of the cell positions having one or more defect cells may be selected from the sample defect map as clustering targets.

For example, only high bad ratio cell positions obtained by a predetermined standard may be selected as the clustering targets. In an exemplary embodiment, cell positions having defect cells of greater than or equal to a reference number may be selected as the clustering targets from the sample defect map. Here, the reference number is a value obtained by dividing a subtraction result by 2, the subtraction result obtained by subtracting a number of defect cells at a cell position having a smallest number of defect cells from a number of defect cells at a cell position having a largest number of defect cells from the sample defect map. In the sample defect map shown in FIG. 2, for example, the reference number is (30−1)/2=14.5. Therefore, cells A00, B00 and C02 at which 15 or more defect cells are positioned are selected as high bad ratio cells from the sample defect map shown in FIG. 2. In other words, if clustering is carried out on the sample defect map shown in FIG. 2, clustering target cells are A00, B00 and C02.

Figure 3:
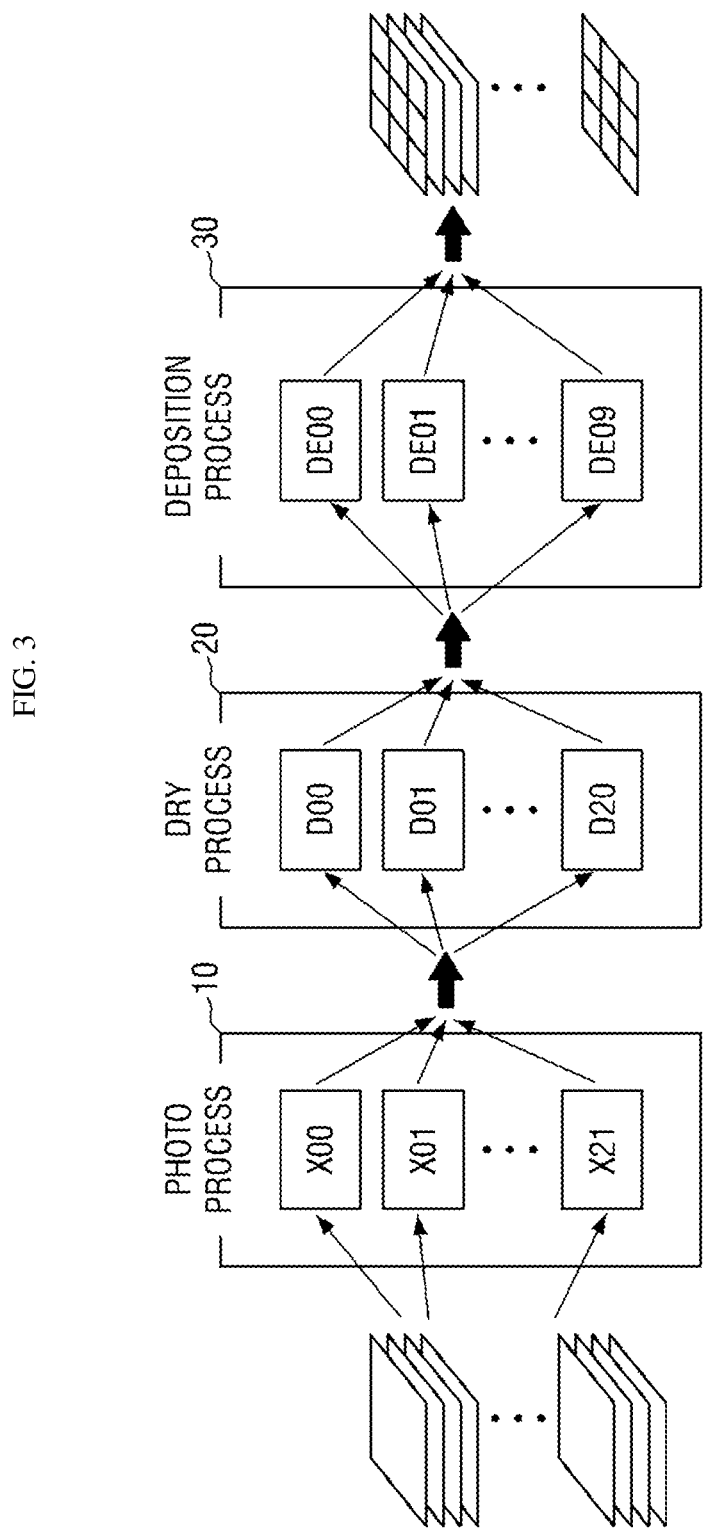
FIG. 3 is a conceptual diagram for explaining a process of producing products as targets for the defect cell clustering method shown in FIG. 1.

Throughout the specification of the present invention, the term "equipment" means a particular equipment in a particular process. That is to say, the equipment in the specification of the present invention is identified by a combination of a process identifier and an equipment identifier. For example, when equipment X is used in processes A and B, the equipment X of the process A and the equipment X of the process B are treated as different equipments. The meaning of the term "equipment" used in the specification of the present invention will now be described with reference to FIG. 3. Assuming that some products are produced through a PHOTO process 10, a DRY process 20, and a DEPOSITION process 30, one of various equipments in a process is assigned to the products and the products pass through the assigned equipment. For example, in a case of glass products for an OLED panel, even if all of a first glass, a second glass and a third glass sequentially pass through the PHOTO process 10, the DRY process 20, and the DEPOSITION process 30, the first glass passes through equipment X00 of the PHOTO process 10, equipment D00 of the DRY process 20 and equipment DE00 of the DEPOSITION process 30. The second glass passes through equipment X01 of the PHOTO process 10, equipment D00 of the DRY process 20 and equipment DE01 of the DEPOSITION process 30. The third glass passes through equipment X05 of the PHOTO process 10, equipment D00 of the DRY process 20 and equipment DE03 of the DEPOSITION process 30. That is to say, the products may pass through different equipments according to specifications of the products. Hereinafter, the clustering method and apparatus according to the present invention will be described with regard to products produced through various processes shown in FIG. 3.

Referring again to FIG. 1, after the generating of the sample defect map (S101) and the selecting of the high bad ratio cell positions from the sample defect map (S102) are completed, using pass equipment information for each product, which is derived from work-in-process (WIP) information, suspected bad equipments are selected among equipments through which products having defect cells at high bad ratio cell positions have passed for the respective high bad ratio cell positions (S104). Here, it is noted that only the suspected bad equipments, rather than all equipments through which all products included in samples have passed, are selected among the equipments through which the products having defect cells at high bad ratio cell positions have passed. Hereinafter, a method for selecting suspected bad equipments will be described with reference to FIGS. 4 to 8.

The suspected bad equipments may be selected based on bad ratios. FIG. 4 shows an exemplary table showing computation results of bad ratios for the respective equipments through which products having defect cells at high bad ratio cell positions have passed for each of the high bad ratio cell positions. For the sake of convenient explanation, FIG. 4 shows positions of only three cells A00, B00 and C02. However, bad ratios for the respective equipments through which products having defect cells at high bad ratio cell positions have passed are computed for positions of all of the cells selected as high bad ratio cells.

The bad ratio of a particular equipment for a particular cell position is computed based on a value obtained by dividing a number of defects of the particular equipment by a number of defects of a process to which the particular equipment belongs. Here, the number of defects of a process to which the particular equipment belongs is a number of products having passed through the process to which the particular equipment belongs among products each having a defect cell at the particular cell position, and the number of defects of the particular equipment is a number of products having passed through the particular equipment among products each having a defect cell at the particular cell position.

Referring to FIG. 4, when a cell position is A00, the bad ratio of equipment PHOTO_X04 is "2/30", which means that among products in samples having defect cells at the cell position A00, a number of products having passed through a PHOTO process is 30, and a number of products on which the PHOTO process is performed through equipment X04 is 2. Referring again to FIG. 4, when a cell position is A00, the bad ratio of equipment DRY_D20 is "4/40", which means that among products in samples having defect cells at the cell position A00, a number of products having passed through a DRY process is 40, and a number of products on which the DRY process is performed through equipment D20 is 4.

After the bad ratios for the respective equipments through which products having defect cells at high bad ratio cell positions have passed are computed for high bad ratio cell positions, a predetermined number of suspected bad equipments may be selected for the respective high bad ratio cell positions in an ascending order of the bad factors.

Referring to FIG. 5, for example, the equipment having the highest bad ratio for the cell A00 is equipment "DRY_D04", and the equipment having the highest bad ratio for the cell B00 is equipment "DRY_X04".

Meanwhile, problematic equipment is highly likely to cause a problem to multiple cells, not just one cell, and the same equipment may be selected as the high bad ratio equipment for multiple cells. That is to say, the equipment selected as the high bad ratio equipment of the first cell position may also be selected as the high bad ratio equipment of the second cell position. According to the present embodiment, in order to avoid redundant operations, a sum of sets of high bad ratio equipments of the respective high bad ratio cell positions is obtained. The sum of sets will now be referred to as a suspected bad equipment candidate set. FIG. 6 shows a suspected bad equipment candidate set for bad samples.

The suspected bad equipment may be selected by further reflecting a good ratio based on the bad ratio. The good ratio is obtained for the purpose of determining how many good products have passed through each of equipments included in the suspected bad equipment candidate set using targets of good samples including good products without defect cells.

The number of good products included in good samples may be determined in proportion to the number of products included in the bad samples. For example, 10% of the number of products included in the bad samples may be determined as the number of good products included in the good samples. If the number of the bad samples is 1000, for example, the number of the good samples may be 100. The following description will be made with respect to a case where the number of good samples is 100.

Utilizing the fact that a more seriously problematic equipment will have a lower good ratio, suspected bad factors may be obtained by subtracting the good ratios from the bad ratios of the respective equipments for the respective cell positions, and a predetermined number of suspected bad equipments may be selected for the respective cell positions based on the suspected bad factors. The selecting of the suspected bad equipments for the respective cell positions based on the suspected bad factors will now be described in more detail with reference to FIG. 7.

The good ratio of the particular equipment is computed based on a value obtained by dividing a number of good products of the particular equipment by a number of good products of a process to which the particular equipment belongs. Here, the number of good products of a process to which the particular equipment belongs is a number of good products having passed through the process to which the particular equipment belongs, and the number of good products of the particular equipment is a number of good products having passed through the particular equipment. For example, FIG. 7 shows that equipment "DRY_D04" has a good ratio of 2/100, i.e., 0.02, which means that all of the good products included in good samples have passed through a "DRY" process and only two of the good products have passed through equipment "DRY_D04". The equipment "DRY_D04" has the same good ratio, irrespective of cell positions. Referring to FIG. 7, the good ratio of equipment "DRY_D04" is 0.02 (=2/100) at both positions of cells A00 and B00.

If the good ratios are all computed, suspected bad factors are computed by dividing good ratios from bad ratios for suspected bad equipment candidates at the respective cell positions. Unlike the good ratio, the bad ratio has different values for the respective cell positions, and the suspected bad factors may also have different values for the respective cell positions. Here, when the suspected bad factor has a negative value, it should be corrected as "0".

Figures 8, 9:
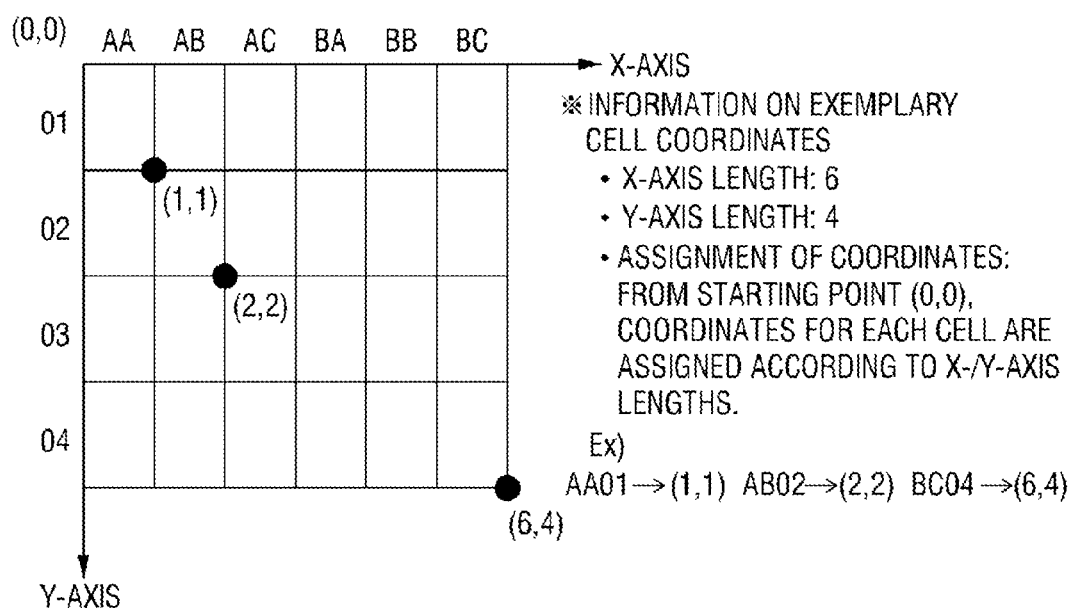

After the computing of the suspected bad factors of the suspected bad equipment candidates for the respective high bad ratio cell positions is completed, a predetermined number (e.g., top 3) of suspected bad equipments for the respective cell positions designated in an ascending order of the suspected bad factors are finally selected as the suspected bad equipments. FIG. 8 shows suspected bad equipments selected for high bad ratio cell positions A00, B00 and C02. In particular, in a case of the cell A00, since there are only two suspected bad equipment candidates having a suspected bad factor exceeding 0, only two of the suspected bad equipments are selected.

Referring back to FIG. 1, after the predetermined number (e.g., top 3) of suspected bad equipments for the respective high bad ratio cell positions are selected as the suspected bad equipments by the clustering method shown in FIGS. 4 to 8, the clustering targets may be grouped into one or more clusters such that a position coherence is established between a first cell position and a second cell position included in one cluster, the first cell position and the second cell position each having at least one suspected bad equipment (S106).

Hereinafter, the meaning of "position coherence" established between two cell positions will be described with reference to FIGS. 9 and 10.

First, in order to determine whether or not a position coherence is established between two cell positions, it is necessary to assign coordinates to each cell of a product, and exemplary coordinates assignment for each cell is illustrated in FIG. 9.

Figure 10:
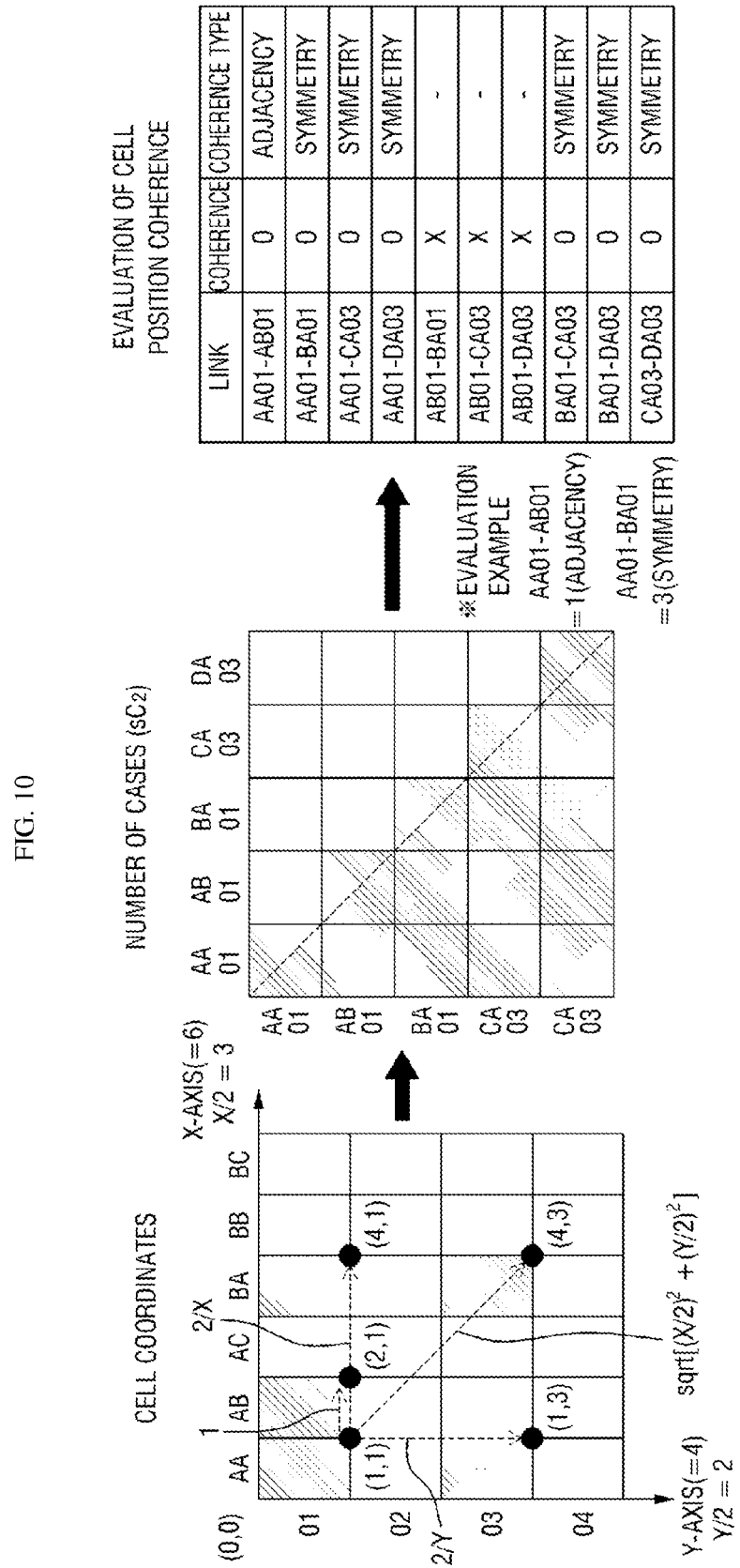
FIG. 10 illustrates a process for testing a position coherence according to the defect cell clustering method shown in FIG. 1.

As shown in FIG. 10, the establishment of the position coherence may mean that an adjacency-type position pattern is established between two cell positions or a symmetry-type position pattern is established between two cell positions. The adjacency-type position pattern is established when two cells are positioned to be adjacent to each other in the X- or Y-axis direction of the product, and the symmetry-type position pattern is established when a distance between two cell positions is half an X-axis length of the product, half a Y-axis length of the product, or half a diagonal length of the product. Shaded cells shown in FIG. 10 are high bad ratio cells as clustering targets.

In more detail, the adjacency-type position pattern is established in a case where a distance between coordinates assigned to two cells is 1.

In the case shown in FIG. 10, for example, the symmetry-type position pattern is established between cells AA01 and CA03, while the adjacency-type position pattern is established between cells AA01 and AB01. Unlike in the conventional art in which only defects that are adjacent to each other are grouped into one cluster, in the present invention, not only adjacent defects but symmetric defects can be grouped into one cluster.

According to the present invention, cell links are generated by combining each two of all of the cell positions included in the clustering targets, and the cell links are maintained only when two cell positions for each of the cell links share one of the suspected bad equipments and a position coherence is established between the two cell positions. Cell positions included in all of the cell links having one or more cell positions overlapping each other are grouped into one cluster using the cell links, which will now be described with reference to FIG. 11.

Figure 11:
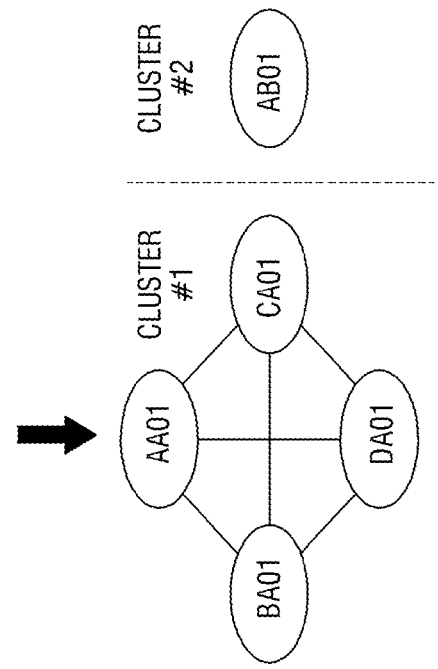
FIG. 11 illustrates a position coherence test and a defect cell causing equipment test according to the defect cell clustering method shown in FIG. 1 and a clustering process according to the test results.

As indicated in the left table shown in FIG. 11, 7 cell links in total, including AA01-AB01, AA01-BA01, and so on, satisfy the adjacency-type position pattern or the symmetry-type position pattern. However, if it is determined that a common suspected bad equipment is not shared by the cells AA01 and AB01, the cells AA01 and AB01 may not be grouped into one cluster, even if they are adjacent to each other.

Consequently, a number of effective cell links that are finally maintained is 6 in total. Using the maintained cell links, clustering is carried out such that cell positions included in all cell links having one or more cell positions overlapping each other are grouped into one cluster. As the result, the clustering into two clusters CLUSTER#1 and CLUSTER#2 is completed.

In a defect cell clustering method according to another embodiment of the present invention, clustering may be carried out on a cell basis using as clustering targets only high bad ratio cell positions among cell positions shown on the sample defect map, which will now be described in detail.

First, a sample defect map is generated, the sample defect map showing a defect cell distribution by cell positions of bad samples including products each including one or more defect cells among products each partitioned into multiple cells. For example, the sample defect map may be generated in such a manner as shown in FIG. 2. The products may be glass sheets used in a small-sized display of a predetermined scale of inches.

Next, cell positions having defect cells of greater than or equal to a reference number are selected as the clustering targets from the sample defect map. The reference number is a value obtained by dividing a subtraction result by 2, the subtraction result obtained by subtracting a number of defect cells at a cell position having a smallest number of defect cells from a number of defect cells at a cell position having a largest number of defect cells from the sample defect map. The cell positions having defect cells of a smaller number than the reference number are excluded from the clustering targets for the purpose of preventing a small number of incidentally generated defect cells from acting as noises on clustering results.

Next, the clustering targets are grouped into one or more clusters such that position coherence is establish between a first cell position and a second cell position included in one cluster. The position coherence refers to one of the adjacency-type position pattern and the symmetry-type position pattern. The adjacency-type position pattern is established when two cells are positioned to be adjacent to each other in the X- or Y-axis direction of the product, and the symmetry-type position pattern is established when a distance between two cell positions is half an X-axis length of the product, half a Y-axis length of the product, or half a diagonal length of the product.

According to the embodiment of the present invention, not only adjacent defects but symmetric defects can be grouped into one cluster. In the OLED or small-sized LCD industry, since each cell has a very small size, clustering is carried out on a cell basis, rather than on a defect spot basis, using defect cells as clustering targets. Even in such a case, a sufficiently high grouping effect can be achieved. In addition, according to the embodiment of the present invention, a defect clustering method specialized to a small-sized display manufacturing process can be provided.

A computer-readable recording medium according to still another embodiment of the present invention may have a computer program recorded therein for executing the defect cell clustering methods shown in FIGS. 1 to 11. That is to say, the defect cell clustering methods shown in FIGS. 1 to 11 may be carried out by executing a computer program. The computer program may be executed by generating a sample defect map showing a defect cell distribution by cell positions of bad samples comprised of products each including one or more defect cells among products each partitioned into a plurality of cells, selecting at least some cell positions having one or more defect cells as clustering targets from the sample defect map, selecting one or more suspected bad equipments for each of cell positions included in the clustering targets using pass equipment information for the product, which is derived from the WIP information, and grouping the clustering targets into one or more clusters according to position coherence between a first cell position and a second cell position included in one cluster.

Figure 12:
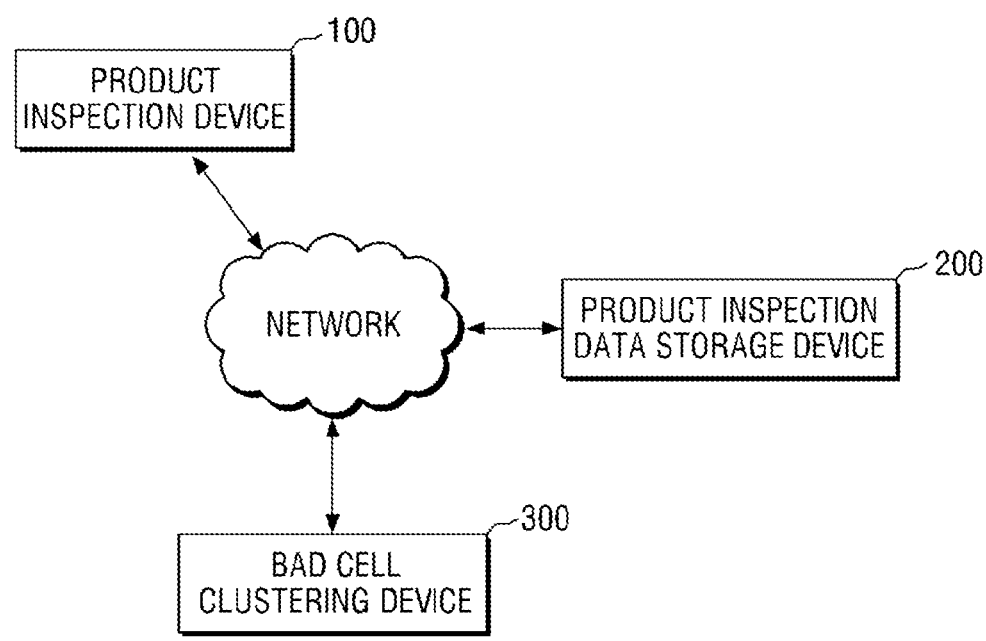
FIG. 12 is a diagram illustrating a configuration of a defect cell clustering system according to another embodiment of the present invention.

Next, a configuration of a defect cell clustering system according to still another embodiment of the present invention will be described with reference to FIG. 12.

A product inspection device 100 determines whether or not defects exist in products having passed through one or more equipments. For example, it may be determined whether or not defects exist in products having passed through one or more equipments by photographing images of the products and processing the images. Based on the determination result, it may be determined whether cells are bad or not. The inspection result of the product inspection device 100 is stored in a product inspection data storage device 200.

A defect cell clustering apparatus 300 clusters at least some among defect cells of products included in bad samples by further reflecting suspected bad equipment information of the respective products selected through WIP information. The WIP information may be derived from a process manager system (not shown). The defect cell clustering apparatus 300 generates a sample defect map showing a defect cell distribution by cell positions of bad samples comprised of products each including one or more defect cells among products each partitioned into a plurality of cells, selects at least some cell positions having one or more defect cells as clustering targets from the sample defect map, selects one or more suspected bad equipments for each of cell positions included in the clustering targets using pass equipment information for the product, which is derived from the WIP information, and groups the clustering targets into one or more clusters according to position coherence between a first cell position and a second cell position included in one cluster, the cell position and the second cell position each having at least one suspected bad equipment.

Figure 13:
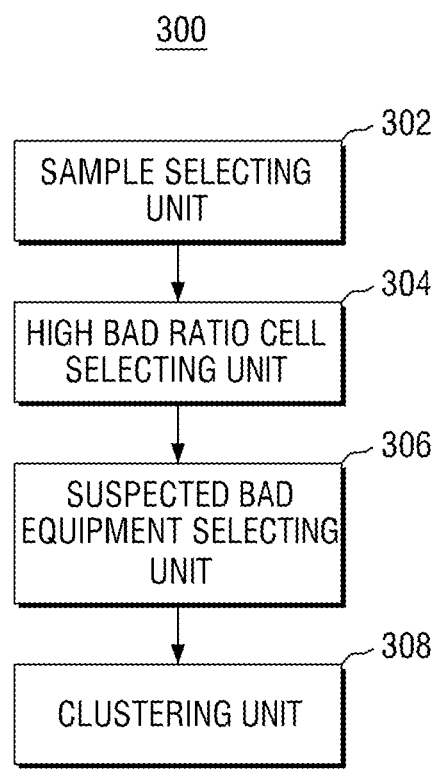
FIG. 13 is a block diagram of a defect cell clustering apparatus according to still another embodiment of the present invention.

As shown in FIG. 13, a defect cell clustering apparatus 300 according to still another embodiment of the present invention may include a sample selecting unit 302, a high bad ratio cells selecting unit 304, a suspected bad equipment selecting unit 306, and a clustering unit 308.

The sample selecting unit 302 generates a sample defect map showing a defect cell distribution by cell positions of bad samples comprised of products each including one or more defect cells among products each partitioned into a plurality of cells. The sample selecting unit 302 may receive standards for selecting the bad samples from a process manager terminal (not shown). The standards for selecting the bad samples may include, for example, at least one of a badness identifier, information for determining the badness identifier (e.g., Good, Reject, Hold, etc.), product name, and inspection data extraction period.

The high bad ratio cells selecting unit 304 selects from the sample defect map cell positions having defect cells of greater than or equal to a reference number as the clustering targets. The high bad ratio cells selecting unit 304 performs clustering only on high bad ratio cell positions having defect cells of greater than or equal to the reference number, thereby preventing a small number of incidentally generated defect cells from acting as noises on clustering results.

The suspected bad equipment selecting unit 306 selects one or more suspected bad equipments for each of cell positions included in the clustering targets using pass equipment information for the product, which is derived from the WIP information. The suspected bad equipment selecting unit 306 computes bad ratios of the respective equipments for the respective cell positions, and one or more suspected bad equipments may be selected for the respective cell positions, using the bad ratios.

In more detail, the suspected bad equipment selecting unit 306 selects high bad ratio equipments for the respective cell positions, obtains a suspected bad equipment candidate set as a sum of sets of the high bad ratio equipments of the respective cell positions, computes good ratios of the respective equipments included in the suspected bad equipment candidate set, computes suspected bad factors by subtracting the good ratios from the bad ratios of the respective equipments for the cell positions, and selects a predetermined number of suspected bad equipments for the respective cell positions in an ascending order of the suspected bad factors.

The clustering unit 308 groups the clustering targets into one or more clusters such that a position coherence is established between a first cell position and a second cell position included in one cluster, the first cell position and the second cell position each having at least one suspected bad equipment. In more detail, the clustering unit 308 generates cell links by combining each two of all the cell positions included in the clustering targets, and maintains the cell links only when two cell positions for each of the cell links share one of the suspected bad equipments and position coherence is established between the two cell positions. Cell positions included in the entire cell links having one or more cell positions overlapping each other may be grouped into one cluster using the cell links.

Results of defect cell clustering carried out by the clustering unit 308 may be supplied to a device (not shown) for performing various analyses for achieving product/process/equipment stabilization, including commonality analysis, history analysis, delay time analysis, and so on.

Figure 14:
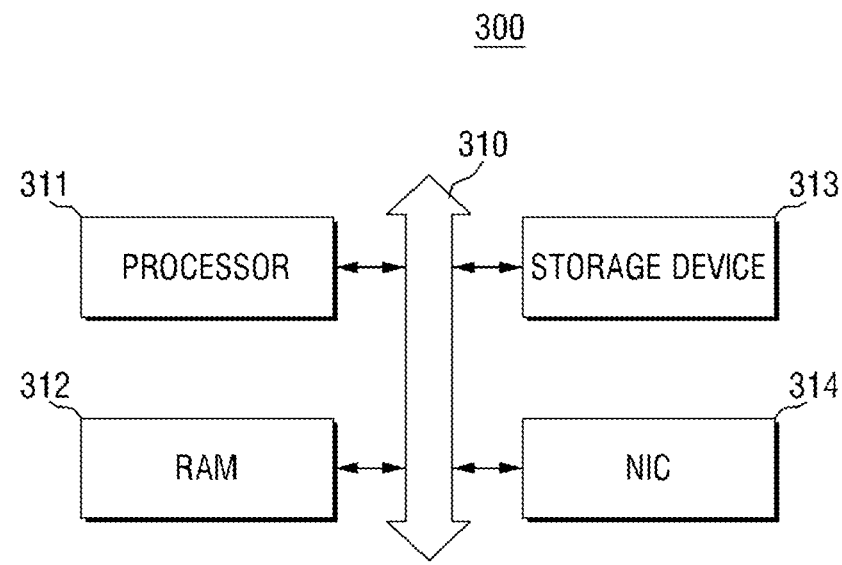
FIG. 14 is a block diagram of a defect cell clustering apparatus according to still another embodiment of the present invention.

The defect cell clustering apparatus 300 may also have the same configuration as shown in FIG. 14. The defect cell clustering apparatus 300 may include a processor 311 processing commands, a storage device 313 storing defect cell clustering program data, a random access memory (RAM)

312, and a network interface (NIC) 314 for data transmission/reception with respect to an external device.

The storage device 313 may store execution files and libraries of a computer program executed by generating a sample defect map showing a defect cell distribution by cell positions of bad samples comprised of products each including one or more defect cells among products each partitioned into a plurality of cells, selecting at least some cell positions having one or more defect cells as clustering targets from the sample defect map, selecting one or more suspected bad equipments for each of cell positions included in the clustering targets using pass equipment information for the product, which is derived from the WIP information, and grouping the clustering targets into one or more clusters such that a position coherence is established between a first cell position and a second cell position included in one cluster, the first cell position and the second cell position each having at least one suspected bad equipment.

While the present invention has been particularly shown and described with reference to exemplary embodiments thereof, it will be understood by those of ordinary skill in the art that various changes in form and details may be made therein without departing from the spirit and scope of the present invention as defined by the following claims. It is therefore desired that the present embodiments be considered in all respects as illustrative and not restrictive, reference being made to the appended claims rather than the foregoing description to indicate the scope of the invention.

What is claimed is:

1. A defect cell clustering method comprising:
generating a sample defect map showing a defect cell distribution of cell positions of bad samples, the bad samples relating to products, each of the products being partitioned into a plurality of cells and including in the plurality of cells one or more defect cells;
selecting from the sample defect map at least some of the cell positions, having one or more of the defect cells, as clustering targets;
selecting, for each of the cell positions in the clustering targets, at least one suspected bad equipment, based on pass equipment information for the products,
wherein the pass equipment information is information of at least one equipment the products have passed through during a process for producing each of the products, and the at least one suspected bad equipment is at least one suspected equipment generating the defect cells during the process for producing each of the products, among the at least one equipment the products have passed through; and
grouping the clustering targets into one or more clusters, according to a position coherence between a first one of the cell positions and a second one of the cell positions included in one cluster, the first and second cell positions each having the at least one suspected bad equipment in common;
wherein the generating, the selecting of at least some of the cell positions, the selecting the at least one suspected bad equipment, and the grouping are implemented by a hardware processor.

2. The defect cell clustering method of claim 1, wherein the selecting of the at least one suspected bad equipment comprises:
computing a bad ratio for each of equipments for each of the cell positions; and
selecting the at least one suspected bad equipment for each of the cell positions based on the bad ratio,
wherein the bad ratio of a particular one of the equipments, for a particular one of the cell positions, is computed based on a value obtained by dividing
a number of defects of the particular one of the equipments by
a number of defects of a process to which the particular one of the equipments belongs,
where:
the number of defects of the process to which the particular one of the equipments belongs is a number of products having passed through the process to which the particular one of the equipments belongs, among the products having the one or more defect cells at the particular one of the cell positions, and
the number of defects of the particular one of the equipments is a number of the products having passed through the particular one of the equipments among the products having the one or more defect cells at the particular one of the cell positions.

3. The defect cell clustering method of claim 2, wherein the selecting of the at least one suspected bad equipment further comprises:
selecting one or more high bad ratio equipment for the respective cell positions;
obtaining a suspected bad equipment candidate set as a sum of sets of the high bad ratio equipment for the respective cell positions;
computing good ratios of the respective equipments included in the suspected bad equipment candidate set;
computing suspected bad factors by subtracting the good ratios from the bad ratios of the respective equipments for the respective cell positions; and
selecting a predetermined number of suspected bad equipment for the respective cell positions in an ascending order of the suspected bad factors.

4. The defect cell clustering method of claim 3, wherein the computing of the good ratios comprises:
computing the good ratios of the respective equipments of good samples including good products without defect cells, wherein the good ratio of the particular one of the equipments is computed based on a value obtained by dividing:
a number of good products of the particular one of the equipments, by
a number of good products of a process to which the particular one of the equipments belongs,
where:
the number of good products of the process to which the particular one of the equipments belongs is a number of good products having passed through the process to which the particular one of the equipments belongs, and
the number of good products of the particular one of the equipments is a number of good products having passed through the particular one of the equipments.

5. The defect cell clustering method of claim 4, further comprising determining the number of good products included in good samples in proportion to the number of products included in the bad samples.

6. The defect cell clustering method of claim 1, wherein:
the position coherence includes one of an adjacency-type position pattern and a symmetry-type position pattern,
the adjacency-type position pattern is established when two cells are positioned to be adjacent to each other in the X- or Y-axis direction of each of the products, and
the symmetry-type position pattern is established when a distance between two cell positions is at least one of:

half an X-axis length of each of the products,
half a Y-axis length of each of the products, and
half a diagonal length of each of the products.

7. The defect cell clustering method of claim 1, wherein the grouping of the clustering targets comprises:
generating cell links by combining into pairs all of the cell positions included in the clustering targets;
maintaining the cell links of only the pairs in which the two cell positions share one of the at least one suspected bad equipment and have an established position coherence; and
grouping ones of the cell positions included in all of the maintained cell links having one or more overlapping cell positions, using the cell links.

8. The defect cell clustering method of claim 1, wherein the selecting of the at least some of the cell positions comprises:
subtracting a number of defect cells at a cell position having a smallest number of defect cells from a number of defect cells at a cell position having a largest number of defect cells to obtain a subtraction result;
dividing the subtraction result by 2 to obtain a reference number; and
selecting from the sample defect map at least some of the cell positions, having a respective number, of the defect cells, greater than or equal to the reference number, as the clustering targets.

9. A computer program product including a non-volatile computer-readable recording medium storing instructions adapted to enable a computer system to implement operations comprising:
generating a sample defect map showing a defect cell distribution of cell positions of bad samples, the bad samples relating to products, each of the products being partitioned into a plurality of cells and including in the plurality of cells one or more defect cells;
selecting from the sample defect map at least some of the cell positions, having one or more of the defect cells, as clustering targets;
selecting, for each of the cell positions in the clustering targets, at least one suspected bad equipment, based on pass equipment information for the products,
wherein the pass equipment information is information of at least one equipment the products have passed through during a process for producing each of the products and, the at least one suspected bad equipment is at least one suspected equipment generating the defect cells during the process for producing each of the products, among the at least one equipment the products have passed through; and
grouping the clustering targets into one or more clusters, according to a position coherence between a first one of the cell positions and a second one of the cell positions included in one cluster, the first and second cell positions each having the at least one suspected bad equipment in common;
wherein the generating, the selecting of at least some of the cell positions, the selecting the at least one suspected bad equipment, and the grouping are implemented by a hardware processor.

10. A defect cell clustering apparatus comprising
a sample selecting unit configured to generate a sample defect map showing a defect cell distribution of cell positions of bad samples, the bad samples relating to products, each of the products being partitioned into a plurality of cells and including in the plurality of cells one or more defect cells;
a selector configured to select from the sample defect map at least some of the cell positions, having one or more of the defect cells, as clustering targets;
a suspected bad equipment selecting unit configured to select at least one suspected bad equipment for each of the cell positions in the clustering targets, based on pass equipment information for the products derived from work-in-process (WIP) information,
wherein the pass equipment information is information of at least one equipment the products have passed through during a process for producing each of the products and, the at least one suspected bad equipment is at least one suspected equipment generating the defect cells during the process for producing each of the products, among the at least one equipment the products have passed through; and
a clustering unit configured to group the clustering targets into one or more clusters, according to a position coherence between a first one of the cell positions and a second one of the cell positions included in one cluster, the first and second cell positions each having the at least one suspected bad equipment in common;
wherein one or more of the sample selecting unit, the selector, the suspected bad equipment selecting unit, and the clustering unit are implemented by a hardware processor.

* * * * *